United States Patent
Higgins

(10) Patent No.: US 9,239,349 B2
(45) Date of Patent: Jan. 19, 2016

(54) TIME DOMAIN ELECTROMAGNETIC INTERFERENCE MONITORING METHOD AND SYSTEM

(75) Inventor: Simon Higgins, Johannesburg (ZA)

(73) Assignee: Eskom Holdings SOC Limited, Johannesburg (ZA)

( * ) Notice: Subject to any disclaimer, the term of this patent is extended or adjusted under 35 U.S.C. 154(b) by 1108 days.

(21) Appl. No.: 13/258,768

(22) PCT Filed: Sep. 18, 2009

(86) PCT No.: PCT/IB2009/054089
§ 371 (c)(1),
(2), (4) Date: Feb. 9, 2012

(87) PCT Pub. No.: WO2010/103354
PCT Pub. Date: Sep. 16, 2010

(65) Prior Publication Data
US 2012/0130665 A1    May 24, 2012

(30) Foreign Application Priority Data
Mar. 9, 2009    (ZA) .................................. 2009/01659

(51) Int. Cl.
*G01R 23/16*   (2006.01)
*G01R 29/08*   (2006.01)
(52) U.S. Cl.
CPC ............ *G01R 29/0892* (2013.01); *G01R 23/16* (2013.01); *G01R 29/0814* (2013.01)
(58) Field of Classification Search
None
See application file for complete search history.

(56) References Cited

U.S. PATENT DOCUMENTS 6,636,816 B1    10/2003    Dvorak et al.
2002/0093341 A1    7/2002    Kobuchi et al.
(Continued)

FOREIGN PATENT DOCUMENTS

| EP | 1072897 A2 | 1/2001 |
| JP | 2003-98194 | 4/2003 |
| WO | 2006/015038 A2 | 2/2006 |

OTHER PUBLICATIONS

Barford, Lee et al., "Fourier Analysis from Networked Measurements Using Time Synchronization," IMTC 2005—Instrumentation and Measurement Technology Conference, pp. 1637-1641 (2005).

(Continued)

*Primary Examiner* — Aditya Bhat
(74) *Attorney, Agent, or Firm* — Nelson Mullins Riley & Scarborough LLP; Anthony A. Laurentano

(57) ABSTRACT

This invention relates to a method of, and a system for, monitoring electromagnetic interference. The method comprising capturing a plurality of time domain waveforms, and a plurality of scatter plots; receiving the plurality of captured time domain waveforms and scatter plots; applying a fast fourier transform (FFT) to each of the received time domain waveforms as it is received thereby to receive FFT outputs; storing the FFT outputs in a database; generating a statistically representative spectrograph or spectrogram in the frequency domain based on at least the stored FFT outputs and scatter plots or data associated with the scatter plots, combining constituent FFTs of the statistically representative spectrograph or spectrogram in such a manner as to emulate the result that would be produced by an EMI (Electromagnetic Interference) receiver or spectrum analyzer; and combining resultant outputs from a number of iterations of this process to produce a final result (EMI spectrum).

15 Claims, 4 Drawing Sheets

(56) References Cited

U.S. PATENT DOCUMENTS

2002/0114383 A1* 8/2002 Belge et al. .................. 375/222
2006/0043979 A1* 3/2006 Wu ................................ 324/627

OTHER PUBLICATIONS

Betta, Giovanni et al., "A DSP-based FFT-Analyzer for the Fault Diagnosis of Rotating Machine Based on Vibration Analysis," IEEE Instrumentation and Measurement Technology Conference, pp. 572-577 (2001).

Kuisma, M. et al., "Using Spectrograms in EMI-analysis—An Overview," APEC 2005, Twentieth Annual IEEE Conference and Exposition on Applied Power Electronics, vol. 3:1953-1958 (2005).

Lee, Yuang-Shung et al., "Time Domain Measurement System for Conducted EMI and CM/DM Noise Signal Separation," IEEE PEDS, International Conference on Power Electronics and Drives Systems, vol. 2:1640-1645 (2005).

Nelson, Jody J. et al., "HEV System EMC Investigation during Transient Operations," Proceedings, 18th Int. Zurich Symposium on EMC, pp. 205-208 (2007).

* cited by examiner

TIME DOMAIN ELECTROMAGNETIC INTERFERENCE MONITORING METHOD AND SYSTEM

RELATED APPLICATIONS

This application is a 35 U.S.C. 371 national stage filing of International Application No. PCT/IB2009/054089, filed Sep. 18, 2009, which claims priority to South Africa Patent Application No. 2009/01659 filed on Mar. 9, 2009 in South Africa. The contents of the aforementioned applications are hereby incorporated by reference.

BACKGROUND OF THE INVENTION

THIS invention relates to a method of and a system for monitoring electromagnetic interference.

Electromagnetic Interference (EMI) signals are emitted by most high voltage (HV) apparatus or equipment. These signals or emissions usually cover a wide bandwidth and are determined by, amongst other things, operating voltage, apparatus design and geometry, insulation class and condition. Additionally, depending on the method of acquisition, the associated spectra of these signals may be polluted by components from extraneous sources. Specifically, generator EMI spectra cover a bandwidth from very low frequencies up to about 1 GHz. The most important component of this band is from approximately 150 kHz to 250 MHz. The signals in this bandwidth typically approach true randomness and the discrepancy between peak (PK) and quasi-peak (QP) values can be as much as about 10 dB.

EMI spectra are captured by way of frequency domain acquisition equipment for example spectrum analysers or EMI test receivers (also known as RF receivers or frequency selective voltmeters). These types of devices are relatively expensive and proper representation of wideband chaotic EMI signals requires the implementation of very long scan times when using these frequency domain acquisition devices. The high cost of these devices and the long scan times required conspire against the practicality of widely deploying on-line real-time monitoring systems based on these acquisition options.

Another, alternate approach, is to capture a number of time domain representations of the electromagnetic emission and then in post processing, compile these time domain captures into a long pulse train that is statistically representative of the original emission. Generally, this statistically representative pulse train is then processed via a short-time discrete Fourier transform (STFT) to produce a spectrogram which is statistically representative of the original EMI emission. In particular, the STFT is a series of fast Fourier transforms (FFT), where the input to each FFT is a subset of the overall pulse train, much shorter in length than the entire pulse train. Successive FFTs process incrementally shifted subsets of the entire pulse train. The output is a set of FFTs, each representing the spectrum of the EMI emission at a different point in time. Such a set of FFTs is called a spectrogram. The FFTs of the spectrogram can be combined with one another to produce an output equivalent to an EMI receiver. The methodology of combination depends on the choice of detector (peak, quasipeak, etc.). Such systems are usually termed Time-Domain EMI (TDEMI) systems.

It is an object of the present invention to monitor EMI signals more conveniently and more cost effectively analysing time domain signals.

SUMMARY OF THE INVENTION

According to a first aspect of the invention, there is provided a method of monitoring electromagnetic interference, the method comprising:
  capturing and/or generating a plurality of time domain waveforms, and a plurality of scatter plots
  storing the plurality of captured or generated time domain waveforms and scatter plots;
  applying a fast fourier transform (FFT) to each of the stored time domain waveforms as it is received thereby to produce FFT outputs;
  storing the FFT outputs in a database;
  generating a statistically representative spectrograph or spectrogram in the frequency domain based on at least the stored FFT outputs and scatter plots or data associated with the scatter plots,
  combining constituent FFTs of the statistically representative spectrograph or spectrogram in such a manner as to emulate a result that would be produced by an EMI (Electromagnetic Interference) receiver or spectrum analyser; and
  combining resultant outputs from a number of iterations of this process to produce an EMI spectrum that is statistically equivalent to the actual EMI spectrum associated with the signal source under examination.

The EMI spectrum produced may advantageously be substantially similar to an EMI spectrum that would be produced with an EMI receiver.

Each iteration may use time domain captures achieved with different configurations of capturing hardware. This may advantageously allow a final result covering a wider bandwidth of frequencies than would otherwise be achievable.

The method may comprise storing the respective spectrograph or spectrogram in the database and/or presenting the spectrograph or spectrogram visually typically to a user.

Each processed time domain capture may comprise at least one pulse and a corresponding time offset value associated therewith.

The method may comprise:
  determining a peak amplitude of the received pulse;
  using the received time offset value and the determined peak amplitude to allow the time domain capture to be referenced to a particular location on the scatter plot with an appropriate time stamp; and
  determining or calculating from this location on the scatter plot, intensity values thereby at least to determine a likely repetition rate of pulses similar to the received pulse.

The method may comprise using the determined repetition rate when generating the spectrogram or spectrograph thereby to represent the number of times a pulse is repeated.

The method may comprise:
  determining from each scatter plot, a total pulse count;
  passing, at each frequency point under consideration, the corresponding value from each FFT in the spectrogram, in a sequence determined by a sequencing array, to a cascaded first-order infinite impulse response (IIR) filter at suitable timing determined by the determined total pulse count;
  combining outputs of the IIR filter to produce a final quasi-peak spectrum;
  passing, at each frequency point under consideration, the corresponding value from each FFT in the spectrogram to a peak detector algorithm; and
  combining outputs of the peak detector algorithm to produce a final peak spectrum.

The method may comprise repeating the method for each of the three electrical phases of the equipment under test.

According to a second aspect of the invention, there is provided a system of monitoring electromagnetic interference, the system comprising:

a waveform capture module arranged to capture and/or generate a plurality of time domain waveforms, a scatter plot generation module arranged to generate a plurality of scatter plots;

a data receiver module arranged to receive the plurality of captured and/or generated time domain waveforms and scatter plots;

a fast fourier transform (FFT) module arranged to apply fast fourier transform (FFT) analysis to each of the received time domain waveforms as it is received and produce FFT outputs;

a database arranged to store the FFT outputs therein;

a spectrograph generating module arranged to generate a statistically representative spectrograph or spectrogram in the frequency domain based on at least the stored FFT outputs and analysis of scatter plots, and a processor arranged to:

combine constituent FFTs of the statistically representative spectrograph or spectrogram in such a manner as to emulate a result that would be produced by an EMI (Electromagnetic Interference) receiver or spectrum analyser; and combine resultant outputs from a number of iterations of this process to produce an EMI spectrum that is substantially statistically equivalent to an actual EMI spectrum associated with a signal source under examination.

The system may comprise a peak (PK) and quasi peak (QP) detector module arranged to apply PK and QP algorithms to the spectrogram outputs respectively so as to produce a frequency domain output result which is statistically representative of the signal source under examination.

The system may comprise an amplitude correction module arranged to operate on at least outputs from the FFT module to remove effects of equivalent noise.

The system may comprise infinite impulse response (IIR) filter/s arranged to model the behavior of an analogue quasi-peak detection circuit of a conventional EMI receiver's charge, discharge and meter constants.

The waveform capture module may be configured to produce and/or generate more than one different sets of time domain captures, each with different, configuration settings.

The amplitude correction module may be arranged to apply a reverse filter amplitude correction to correct for low frequency attenuation associated with captured time domain waveforms.

The PK detector module may be arranged to determine peak amplitude of the received pulse.

The processor may be arranged to:

use a received time offset value and the determined peak amplitude of the received pulse to allow the time domain capture to be referenced to a particular location on the scatter plot with an appropriate time stamp; and determine from this location on the scatter plot, intensity values thereby at least to determine a likely repetition rate of pulses similar to the received pulse.

The spectrograph generating module may be arranged to use the determined repetition rate when generating the spectrogram or spectrograph thereby representing the number of times a pulse is repeated.

The processor may be arranged to:

determine, from each scatter plot, a total pulse count;

pass, at each frequency point under consideration, the corresponding value from each FFT in the spectrogram, in a sequence determined by a sequencing array, to the infinite impulse response (IIR) filter at a suitable timing determined by the determined total pulse count;

combine outputs of the IIR filter to produce a final quasi-peak spectrum;

pass, at each frequency point under consideration, the corresponding value from each FFT in the spectrogram to the PK detector module; and combine outputs of the PK detector module to produce a final peak spectrum.

DESCRIPTION OF PREFERRED EMBODIMENTS

In the following description, for purposes of explanation, numerous specific details are set forth in order to provide a thorough understanding of an example embodiment of the present disclosure. It will be evident, however, to one skilled in the art that the present disclosure may be practiced without these specific details.

Figure 1:
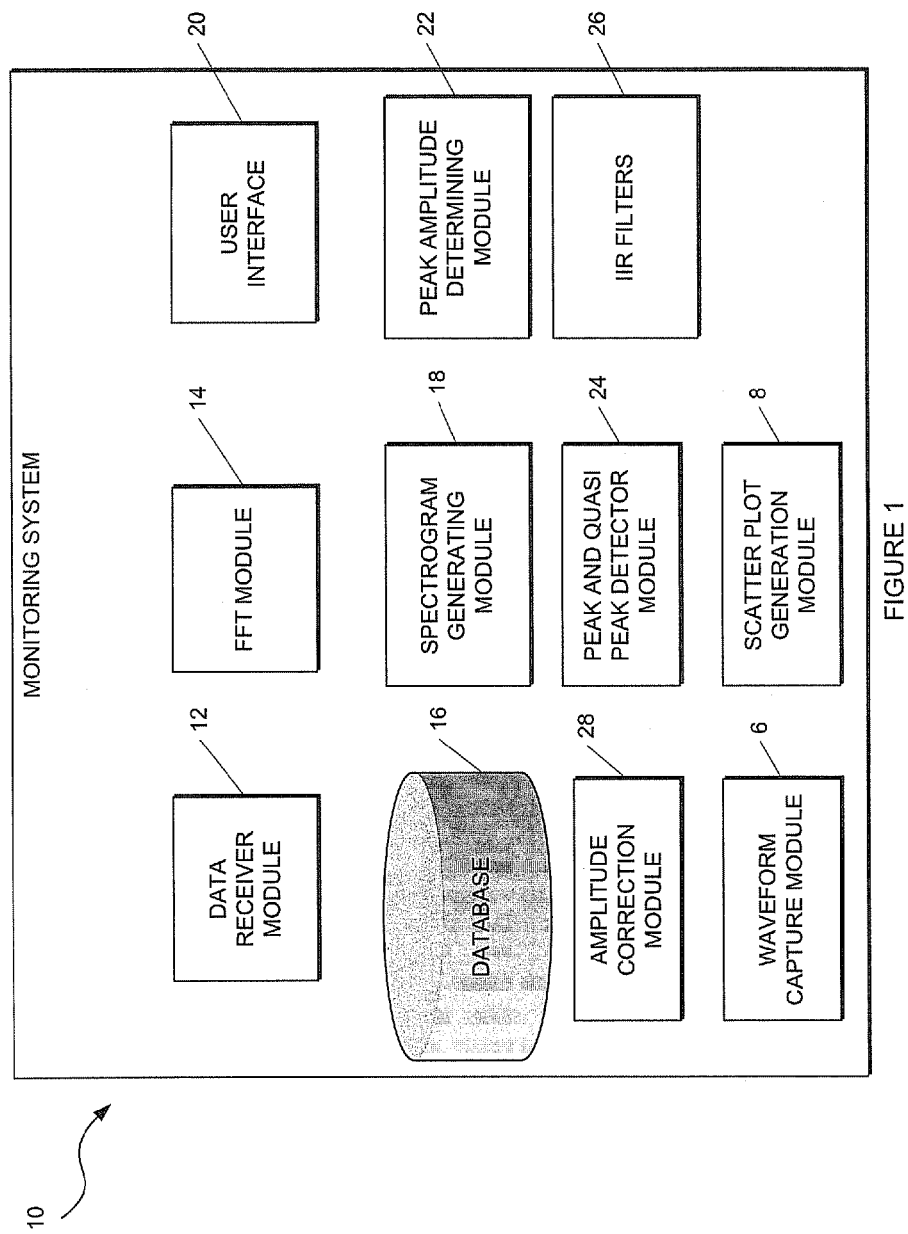
FIG. 1 shows a schematic diagram of a system in accordance with an example embodiment.

Referring now to FIG. 1 of the drawings where a system for monitoring electromagnetic interference (EMI) emitted by equipment in accordance with an example embodiment is generally indicated by reference numeral 10.

The system 10 typically comprises a plurality of components or modules which correspond to the functional tasks to be performed by the system 10. In this regard, "module" in the context of the specification will be understood to include an identifiable portion of code, computational or executable instructions, data, or computational object to achieve a particular function, operation, processing, or procedure. It follows that a module need not be implemented in software; a module may be implemented in software, hardware, or a combination of software and hardware. Further, the modules need not necessarily be consolidated into one device but may be spread across a plurality of devices.

The system 10 includes a waveform capture module 6, which captures the time domain signals. In a preferred example embodiment, the time domain captures within one file is generally referred to as a fileset. The waveform capture module 6 may conveniently be arranged to capture and/or generate time domain waveforms. These time domain waveforms may be associated with the time domain signals or signal source under examination.

The system 10 includes a scatter plot generation module 8 arranged to generate at least one scatter plot. Preferably, the scatter plot generation module 8 generates a plurality of scatter plots. It will be noted that each scatter plot is a graphical display of time domain results collected and superimposed over a period of time. Only local peaks are displayed, not full conventional time domain captures. The scatter plots are three-dimensional. A horizontal axis of the scatter plot represents a certain time period and a vertical axis represents signal amplitude. An image intensity axis represents counts of similar events. Typically, a scatter plot consists of a number of dots, representing amplitude peaks of time domain waveforms. The colour of each dot represents the number of such occurrences. The scatter plot provides good indication of the frequency of occurrence of each type of time domain event.

The system 10 includes a data receiver module 12 communicatively coupled to the waveform capture module 6 and scatter plot generation module 8, and arranged to receive at least a plurality of captured time domain signals and scatter plots from the waveform capture module 6 and scatter plot generation module 8 respectively.

The system 10 includes a Fast Fourier Transform (FFT) module 14 arranged to apply a FFT to each of the received time domain signals to obtain a FFT output in the form of frequency domain spectra.

The system 10 includes a database 16 communicatively coupled to the FFT module 14 arranged at least to store the FFT outputs therein. The system 10 also includes a spectrogram generating module 18 arranged to generate a statistically representative spectrograph or spectrogram in the frequency domain based on at least the FFT outputs stored in the database. The database 16 is also arranged to store the spectrograms therein. The generated scatter plots may also be stored in the database 16.

The system 10 also includes a user interface 20. The user interface 20 typically includes a GUI (Graphical User Interface) displayable on a screen of a personal computer, laptop, PDA (Personal Digital Assistance), or the like. By way of the GUI, a user is able to view the generated spectrograms for example, or any other relevant data stored in the database 16.

It will be noted that each file or time domain capture produced by the waveform capture module 6 and received by the data receiver module 12 typically contains a plurality of pulses, plus information indicating the time delays between the start of the mains waveform period and the start of the pulses, or in other words time offset values. The system 10 analyses these received pulses to determine their peak amplitude by way of a peak amplitude determining module 22.

The system 10 is arranged to use the received offset values and the determined peak amplitude values to allow the time domain captures to be referenced to a particular location on the scatter plot with an appropriate time stamp. In particular, the system 10 uses the abovementioned data to allow the pulses to be referenced to the vertical and horizontal time axes of the scatter plots with an appropriate time stamp.

From the particular location of the scatter plot, the system 10 is arranged to determine intensity values thereby at least to determine a likely repetition rate of pulses similar to the received pulse. Due to uncertainties in the true offset and peak amplitude values, some tolerance must be allowed when referencing the time-domain capture to a location on the scatter plot.

The spectrogram generating module is arranged to use the determined repetition rate to construct or generate the spectrogram.

In an example embodiment, the database 16 is arranged to store the FFT outputs or the set of frequency domain spectra in a FFT array. Typically, a limited number of FFT outputs are required by the system 10. The FFT array is therefore arranged to hold the most recent required number of spectra in a first-in-first out arrangement. Indices of these spectra are then inserted into a sequencing array which defines the statistically representative spectrogram.

The system 10 conveniently comprises a processor 17 arranged to combine constituent FFTs of the statistically representative spectrograph or spectrogram in such a manner as to emulate the result that would be produced by an EMI receiver or spectrum analyser.

The processor 17 may also be arranged to combine resultant outputs from a number of iterations of this process to produce a final result.

The sequencing array typically has more entries than the number of FFT outputs under consideration. In an example embodiment, the index of each FFT output is inserted into the sequencing array several times. It will be noted that the number of times each entry to the sequencing array is duplicated and the separation between repeat entries is determined from the effective repetition rate determined from the scatter plot for each capture as previously described.

The system 10 includes a peak (PK) and quasi peak (QP) detector module 24 arranged to apply PK and QP algorithms to the spectrogram outputs. This is required to produce a frequency domain output result which is statistically representative of the signal source under examination, and therefore acceptably similar to the results that would be achieved with an EMI receiver. In an example embodiment, the sequence in which the FFT outputs are passed to the PK and QP detector module 24 is determined for example by the sequencing array.

It will be noted that the FFT array and sequencing arrays are updated with each new group of waveforms received by the data receiver module 12 or captured waveform capture module 6.

The PK and QP detector module 24 is arranged to analyse the spectrogram one frequency at a time. At each frequency point under consideration, it will be appreciated that the maximum value indicated at that frequency by any of the FFTs in the spectrogram is the output result from the PK and QP detector module 24 for peak detection at that frequency.

The PK and QP detector module 24 is further arranged to determine a quasi-peak detection result also by analysing the spectrogram one frequency at a time. At each frequency point under consideration, the values contributed by the spectrogram are passed through a cascaded implementation of first-order infinite impulse response (IIR) filters 26. The IIR filters 26 are arranged to model the behaviour of the analogue quasipeak detection circuit of a conventional EMI receiver's charge, discharge and meter constants. The filtering process is repeated at each frequency using appropriate contributions from the spectrogram, and timing information as will be discussed below. In other embodiments, proper weighting of the IIR results or factors requires knowledge of the time interval between each FFT in the spectrogram. In the present example embodiment, a novel approach to determining a statistically representative timing interval is adopted as follows. Firstly, a total pulse count is determined from each scatter plot. Secondly, knowledge of the total 'live' time of the scatter plot allows a suitable inter-pulse timing interval to be determined for use in the IIRs. In a preferred embodiment, knowledge of the live time is determined empirically for the scatter plot generation module 8. The live time is determined by, among other things, software configuration and performance of the capturing hardware.

This is typically recomputed for each scatter plot and each spectrogram is processed with the latest available values.

The outputs from the IIR filter 26 are combined by the system 10 to produce a final quasi-peak spectrum.

The system 10 also includes an amplitude correction module 28 arranged to operate on at least outputs from the FFT module 14. In an example embodiment, the amplitude correction module 28 is arranged to remove at least the effects of equivalent noise bandwidth (ENBW) associated with discrete frequency spectra. The module 28 adjusts each discrete frequency spectrum (i.e. FFT) to remove the effect of the ENBW associated with the hardware of the waveform capture module 6 used to capture the time domain waveform.

The amplitude correction module 28 imposes, on the FFT output, a new ENBW equivalent to that of a conventional EMI receiver's intermediate frequency (IF) filter, in order to emulate the behaviour of the conventional EMI receiver. It will be noted that different IF bandwidths are used at different frequencies.

In an example embodiment, the data receiver module 12 receives data from time-domain captures from the waveform capture module 6. It follows that the frequency resolution of the FFT outputs is limited by parameters of the waveform capture module 6. In general, the performance is compromised by such issues as the finite memory depth of available time domain capture hardware, selecting hardware configuration parameters to avoid aliasing, and ENBW figures dependent on these settings.

In the example embodiment, a novel solution to obtaining adequate frequency resolution and dynamic range across the entire required bandwidth has been implemented.

In this novel solution, the waveform capture module 6 is configured to produce more than one different set of time domain captures, each with different, configuration settings. The data receiver module is therefore necessarily configured to receive a plurality of sets of time domain captures, with different carefully selected capture configuration settings. The different sets of captures each produce results containing portions of optimum resolution in different frequency bands.

In this regard, each scatter plot produced by the scatter plot generation module 8 has associated with it one or more groups of time domain captures obtained with varying configuration settings. It follows that the system 10 is arranged to process all the groups of time domain captures. In light of previous explanation, all groups are receivable by the PK and QP detector module 24 for processing as hereinbefore described. The system 10 is then arranged to combine the groups to produce output spectra covering the entire design frequency range as hereinbefore described.

The amplitude correction module 28 is further arranged to apply a reverse filter amplitude correction to correct for the low frequency attenuation that occurs due to the interaction between the waveform capture module 6 and the transducers from which the time domain signals are acquired by the external system.

Figure 2:
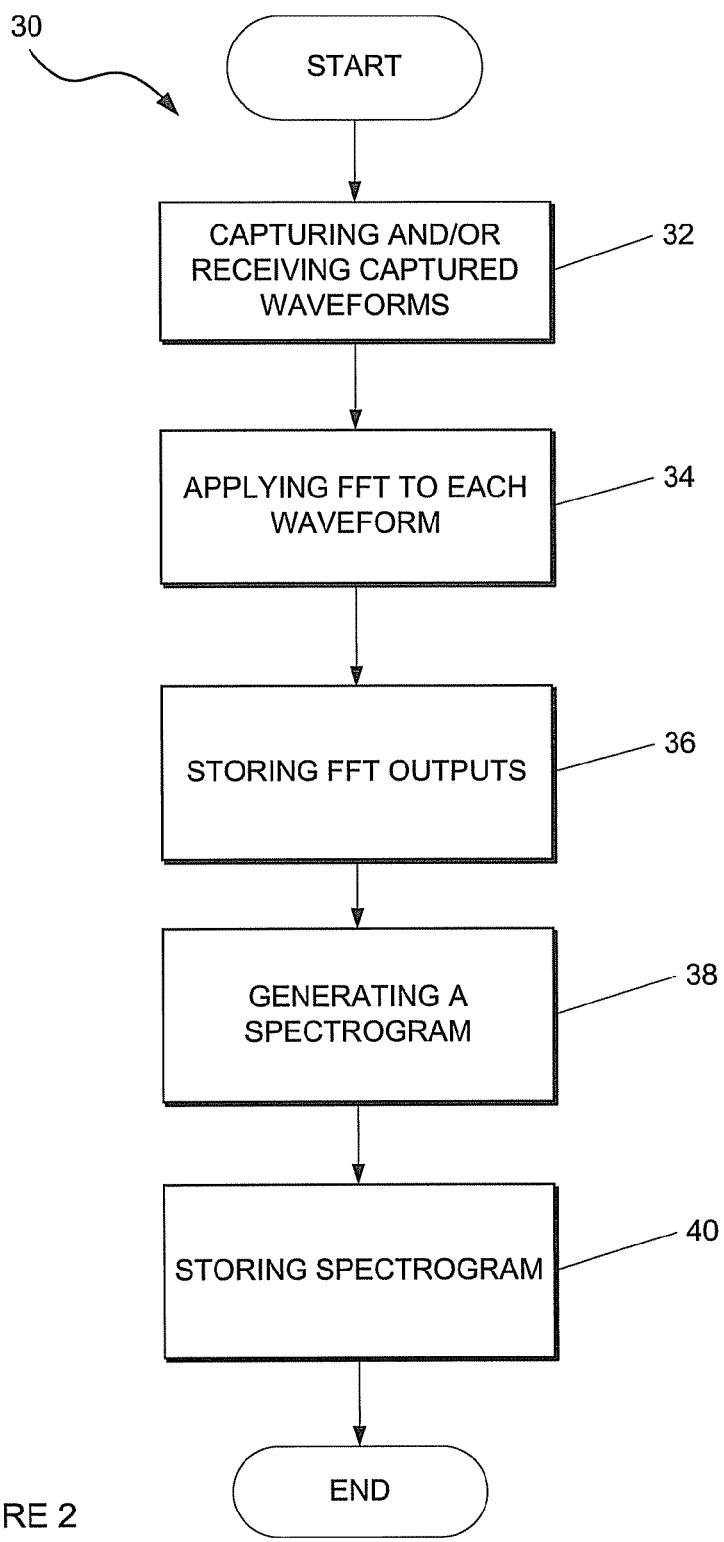
FIG. 2 shows a high level flow diagram of a method in accordance with an example embodiment.
Figure 3:
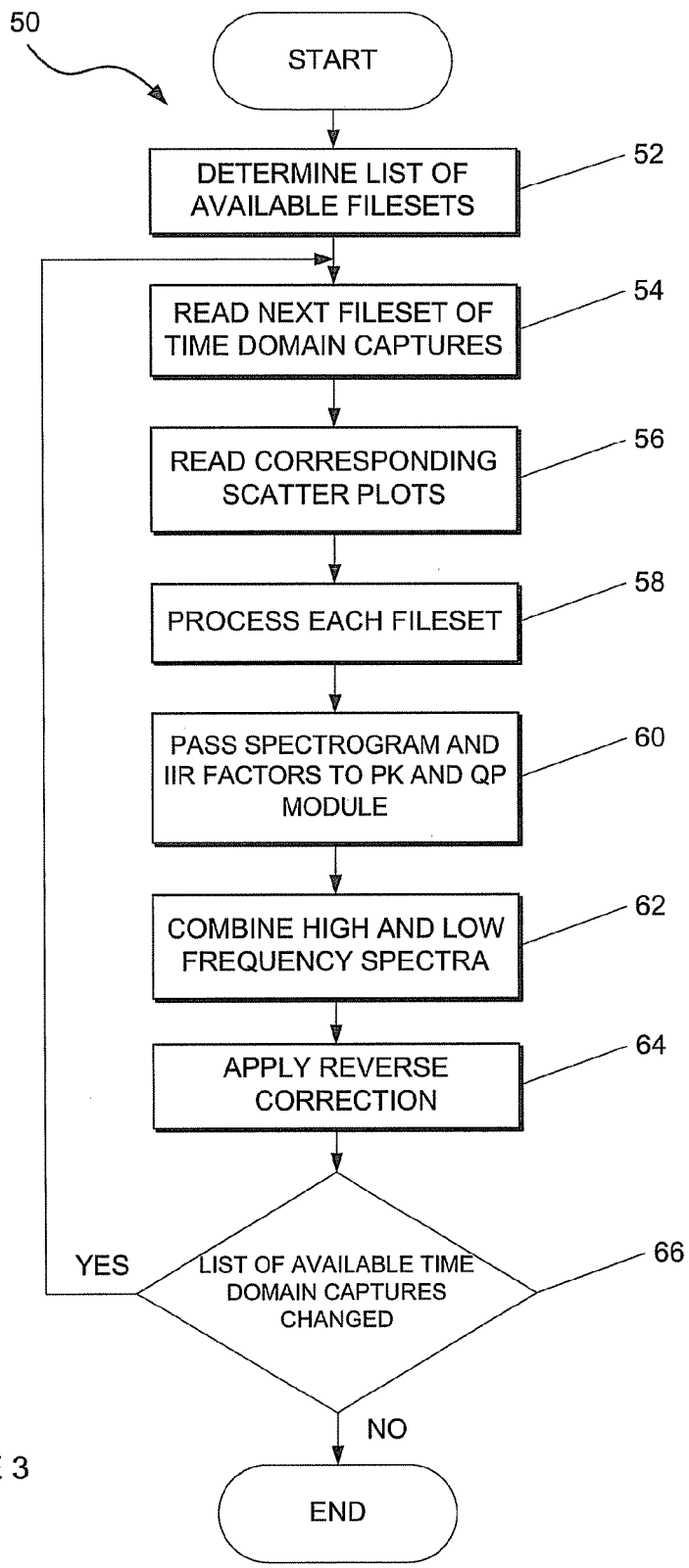
FIG. 3 shows a low level flow diagram of a method in accordance with an example embodiment.
Figure 4:
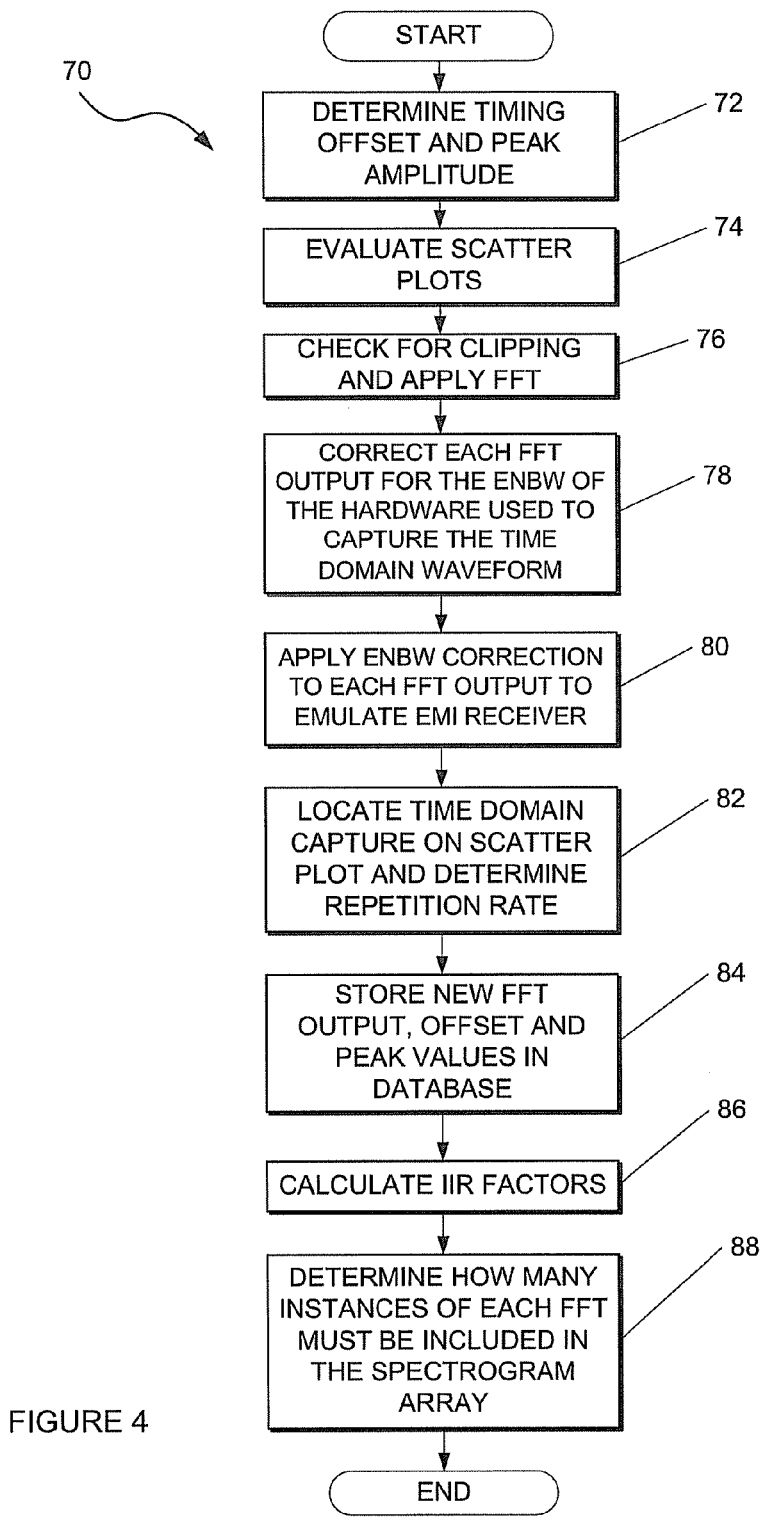
FIG. 4 shows a flow diagram of a step in the flow diagram of FIG. 3 in greater detail.

Example embodiments will now be further described in use with reference to FIGS. 2 to 4. The example methods illustrated by way of flow diagrams in FIGS. 2 to 4 are described with reference to FIG. 1, although it is to be appreciated that the example methods may be applicable to other systems (not illustrated) as well.

Referring to FIG. 2 of the drawings where a flow diagram of a method in accordance with an example embodiment is generally indicated by reference numeral 30.

The method 30 includes capturing and/or receiving, at block 32, a plurality of captured time domain waveforms, and a plurality of scatter plots. The captured timed domain waveforms are captured (or generated) by waveform capture module 6 and received by way of the data receiver module 12 in the form of file/files as hereinbefore described.

The method 30 may comprise generating and/or storing the plurality of time domain waveforms and scatter plots.

The method 30 then includes applying, at block 34, a FFT by way of the FFT module 14 to each of the received time domain waveforms as it is received thereby to receive FFT outputs in the form of frequency domain spectra.

In a preferred embodiment, the method 30 includes storing, at block 36, the FFT outputs in the database 16. The outputs are typically stored in the FFT array as hereinbefore described.

The method 30 further includes generating, at block 38 by way of the spectrogram generating module 18, a statistically representative spectrograph or spectrogram in the frequency domain based on at least the stored FFT outputs. The spectrogram generating module 18 will therefore be understood to control the generation and population of the sequencing array as hereinbefore described thereby to generate the spectrogram.

The method 30 optionally includes storing, at block 40, the generated respective spectrogram in the database 16. Instead, or in addition, the method 30 includes presenting the generated spectrogram to a user via the user interface 20.

The method 30 may preferably include combining (not shown) constituent FFTs of the statistically representative spectrograph or spectrogram in such a manner as to emulate the result that would be produced by an EMI receiver or spectrum analyser.

The method 30 may further preferably include combining (not shown) resultant outputs from a number of iterations of this process to produce a final result. This final result is advantageously an EMI spectrum that is substantially statistically equivalent to the actual EMI spectrum that would be produced with an EMI receiver.

Referring now to FIGS. 3 and 4 of the drawings, where another flow diagram of a method in accordance with an example embodiment is generally indicated by reference numeral 50 (FIG. 3). The method 50 includes determining, at block 52, a list of available filesets of time domain captures. It follows that this may be done by the system 10 from the files produced by the waveform capture module 6 and received by the data receiver module 12.

The method 50 includes reading, at block 54, a next fileset of time domain captures.

The method 50 includes receiving and reading, at block 56, corresponding scatter plots produced by the scatter plot generation module 8 and received by the data receiver module 12.

The method 50 then includes processing, at block 58, each fileset of captured time domain signals. In this regard, it will be noted that flow diagram 70 (FIG. 4) corresponds to the processing step 58. In other words the method steps for processing each fileset is illustrated in FIG. 4.

In particular the method 70 of processing each fileset includes determining, at block 72, the timing offset and peak amplitude of each capture by way of the peak amplitude determining module 22 as hereinbefore described.

The method 70 includes evaluating, at block 74, the received scatter plots to determine the number of pulses represented by the scatter plot within its known live-time. This is used to determine the timing interval between the successive FFTs listed in the sequencing array as hereinbefore described.

The method 70 includes checking, at block 76, each time domain capture for clipping. The method 70 also includes applying or performing, also at block 76, a FFT on the time domain captures as hereinbefore described.

The method 70 includes correcting, at block 78, each FFT output for the ENBW associated with the waveform capture module 6, by way of the amplitude correction module 28 as hereinbefore described. It will be noted that each FFT output is corrected for the ENBW of the hardware used to capture the time domain waveform.

The method 70 further includes applying, at block 80, an ENBW correction to each FFT output by way of the amplitude correction module 28 to conveniently and advantageously simulate or emulate an EMI receiver as hereinbefore described.

The method 70 also includes locating, at block 82, each time domain capture on the relevant scatter plot and estimating its occurrence or repetition rate as hereinbefore described.

The method 70 includes storing, at block 84, at least each new FFT output, its offset, and peak values into the database 16.

The method 70 includes determining or calculating, at block 86, the new IIR factors as hereinbefore described.

The method 70 finally includes determining, at block 88, how many instances of each FFT output must be introduced into the sequencing array which defines the spectrogram as hereinbefore described.

Turning back to the method 50 of FIG. 3 where the method 50 further includes passing, at block 60, the spectrogram and IIR factors to the PK and QP detector module 24 for processing as hereinbefore described.

The method 50 then includes combining, at block 62, results from processing one or more groups of captures (each obtained with different configurations of waveform capture module 6) into one set of output spectra as hereinbefore described.

It will be noted that the method 50 also includes applying, at block 64, the reverse correction for the signal acquisition transducer characteristic by way of the amplitude correction module 28 as hereinbefore described.

The method 50 finally includes checking, at block 66, if the list of available time domain captures has changed, and if it has then the method 50 proceeds to step 54 for the next set of captures.

If the list of available time domain captures has not changed, the system 10 waits idle until the waveform capture module 6 and scatter plot generation module 8 have acquired new data.

It will be appreciated that the above described methods are applied for each of phase to be displayed, for example red, white, blue phases.

The invention as hereinbefore described provides a convenient, cost effective way of capturing and monitoring EMI spectra. The invention is configured to allow the real-time monitoring of EMI spectra, based on continually updated time domain captures. It can also be used to recreate the results in post-processing. The invention includes a unique method of estimating a statistically representative repetition rate of each of the time domain pulses captured. The invention includes a method of combining resultant spectra derived from different sets of time domain captures, where the different sets were obtained with different capture parameters. This allows a final result covering a wider frequency range than would otherwise be possible.

The invention claimed is:

1. A method of monitoring electromagnetic interference in equipment under test, the method comprising:
    capturing and/or generating a plurality of time domain waveforms from the equipment under test, and a plurality of scatter plots;
    storing the plurality of captured and/or generated time domain waveforms and scatter plots;
    applying a fast fourier transform (FFT) to each of the stored time domain waveforms as it is received thereby to produce FFT outputs;
    storing the FFT outputs in a database;
    generating a statistically representative spectrograph or spectrogram in the frequency domain based on at least the stored FFT outputs and scatter plots or data associated with the scatter plots,
    combining constituent FFTs of the statistically representative spectrograph or spectrogram in such a manner as to emulate a spectrum that is produced by an EMI (Electromagnetic Interference) receiver or spectrum analyzer;
    combining resultant outputs from a number of iterations of this process to produce an EMI spectrum that is substantially statistically equivalent to an actual EMI spectrum associated with a signal source under examination,
    determining from each scatter plot, a total pulse count;
    passing, at each frequency point under consideration, the corresponding value from each FFT in the spectrogram, in a sequence determined by a sequencing array, to a cascaded first-order infinite impulse response (IIR) filter at suitable timing determined by the determined total pulse count;
    combining outputs of the IIR filter to produce a final quasi-peak spectrum;
    passing, at each frequency point under consideration, the corresponding value from each FFT in the spectrogram to a peak detector algorithm; and
    combining outputs of the peak detector algorithm to produce a final peak spectrum,
    wherein the substantially statistically equivalent EMI spectrum and the final peak spectrum provide a convenient and a cost effective way to monitor EMI signals.

2. The method as claimed in claim 1, wherein each iteration uses time domain captures achieved with different configurations of capturing hardware.

3. The method as claimed in claim 1, the method comprising storing the respective spectrograph or spectrogram in the database and/or presenting the spectrograph or spectrogram to a user.

4. The method as claimed in claim 1, wherein each processed time domain capture comprises at least one pulse and a corresponding time offset value associated therewith.

5. The method as claimed in claim 4, the method comprising:
    determining a peak amplitude of the received pulse;
    using the received time offset value and the determined peak amplitude to allow the time domain capture to be referenced to a particular location on the scatter plot with a most appropriate time stamp; and
    determining or calculating from this location on the scatter plot, intensity values thereby at least to determine a likely repetition rate of pulses similar to the received pulse.

6. The method as claimed in claim 5, the method comprising using the determined repetition rate when generating the spectrogram or spectrograph thereby to represent the number of times a pulse is repeated.

7. The method as claimed in claim 1, further comprising repeating the method for each of the three electrical phases of the equipment under test.

8. A system of monitoring electromagnetic interference in equipment under test, the system comprising:
    a waveform capture module arranged to capture and/or generate a plurality of time domain waveforms from the equipment under test,
    a scatter plot generation module arranged to generate a plurality of scatter plots;

a data receiver module arranged to receive the plurality of captured and/or generated time domain waveforms and scatter plots;

a fast fourier transform (FFT) module arranged to apply fast fourier transform (FFT) analysis to each of the received time domain waveforms as it is received, and produce FFT outputs;

a database arranged to store the FFT outputs therein;

a spectrograph generating module arranged to generate a statistically representative spectrograph or spectrogram in the frequency domain based on at least the stored FFT outputs and analysis of scatter plots, and a processor arranged to:
  combine constituent FFTs of the statistically representative spectrograph or spectrogram in such a manner as to emulate a spectrum that would be produced by an EMI (Electromagnetic Interference) receiver or spectrum analyser;
  combine resultant outputs from a number of iterations of this process to produce an EMI spectrum that is substantially statistically equivalent to an actual EMI spectrum associated with a signal source under examination,
  arrange one or more infinite impulse response (IIR) filters to model a behavior of an analogue quasipeak detection circuit of a conventional EMI receiver's charge, discharge, and meter constants;
  determine, from each scatter plot, a total pulse count;
  pass, at each frequency point under consideration, the corresponding value from each FFT in the spectrogram, in a sequence determined by a sequencing array, to the infinite impulse response (IIR) filter at a suitable timing determined by the determined total pulse count;
  combine outputs of the IIR filter to produce a final quasi-peak spectrum; pass, at each frequency point under consideration, the corresponding value from each FFT in the spectrogram to the peak (PK) detector module; and
  combine outputs of the PK detector module to produce a final peak spectrum, wherein the substantially statistically equivalent EMI spectrum and the final peak spectrum provide a convenient and a cost effective way to monitor EMI signals.

9. The system as claimed in claim 8, the system comprising a peak (PK) and quasi peak (QP) detector module arranged to apply PK and QP algorithms to the spectrogram outputs respectively so as to produce a frequency domain output result which is statistically representative of the signal source under examination.

10. The system as claimed in claim 9, wherein the PK detector module is arranged to determine peak amplitude of the received pulse.

11. The system as claimed in claim 10, wherein the processor is arranged to:
  use a received time offset value and the determined peak amplitude of the received pulse to allow the time domain capture to be referenced to a particular location on the scatter plot with an appropriate time stamp; and
  determine from this location on the scatter plot, intensity values thereby at least to determine a likely repetition rate of pulses similar to the received pulse.

12. The system as claimed in claim 11, wherein the spectrograph generating module is arranged to use the determined repetition rate when generating the spectrogram or spectrograph thereby representing the number of times a pulse is repeated.

13. The system as claimed in claim 8, the system comprising an amplitude correction module arranged to operate on at least outputs from the FFT module to remove effects of equivalent noise.

14. The system as claimed in claim 13, wherein the amplitude correction module is arranged to apply a reverse filter amplitude correction to correct for low frequency attenuation associated with captured time domain waveforms.

15. The system as claimed in claim 8, wherein the waveform capture module is configured to produce more than one different sets of time domain captures, each with different, configuration settings.

* * * * *